United States Patent
Kim et al.

(10) Patent No.: US 11,037,619 B2
(45) Date of Patent: *Jun. 15, 2021

(54) USING DUAL CHANNEL MEMORY AS SINGLE CHANNEL MEMORY WITH SPARES

(71) Applicant: International Business Machines Corporation, Armonk, NY (US)

(72) Inventors: Kyu-Hyoun Kim, Chappaqua, NY (US); Warren E. Maule, Cedar Park, TX (US); Kevin M. Mcilvain, Delmar, NY (US); Saravanan Sethuraman, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/674,235

(22) Filed: Nov. 5, 2019

(65) Prior Publication Data

US 2020/0075079 A1 Mar. 5, 2020

Related U.S. Application Data

(63) Continuation of application No. 15/860,871, filed on Jan. 3, 2018, now Pat. No. 10,546,628.

(51) Int. Cl.
*G06F 11/00* (2006.01)
*G06F 11/30* (2006.01)
(Continued)

(52) U.S. Cl.
CPC ............ *G11C 11/4076* (2013.01); *G11C 5/04* (2013.01); *G11C 11/24* (2013.01);
(Continued)

(58) Field of Classification Search
CPC ....... G11C 11/4076; G11C 5/04; G11C 11/24; G11C 11/4093; G11C 16/0483;
(Continued)

(56) References Cited

U.S. PATENT DOCUMENTS

| 7,343,458 B2 | 3/2008 | Vogt |
| 8,098,539 B2 | 1/2012 | Sankuratri et al. |

(Continued)

FOREIGN PATENT DOCUMENTS

| CN | 104809031 A | 7/2015 |
| CN | 105556477 A | 5/2016 |

(Continued)

OTHER PUBLICATIONS

International Search Report and Written Opinion for PCT/IB2018/060237 dated Apr. 28, 2019, 9 pages.

(Continued)

*Primary Examiner* — Guerrier Merant
(74) *Attorney, Agent, or Firm* — Cantor Colburn LLP; Bryan Bortnick

(57) ABSTRACT

A technique relates to operating a memory controller. The memory controller drives first memory devices and second memory devices of the memory controller in a dual channel mode. A first error correcting code (ECC) memory device and a second ECC memory device protect the first memory devices and the second memory devices. The memory controller drives the first memory devices and the second memory devices in a single channel mode such that the second ECC memory device is a spare memory device, and the first ECC memory device protects the first memory devices and the second memory devices. The memory controller is configured to switch between the dual channel mode and the single channel mode.

18 Claims, 6 Drawing Sheets

(51) Int. Cl.
| | | |
|---|---|---|
| *G08C 25/00* | (2006.01) | |
| *H03M 13/00* | (2006.01) | |
| *H04L 1/00* | (2006.01) | |
| *G11C 11/4076* | (2006.01) | |
| *G11C 11/24* | (2006.01) | |
| *G11C 11/4093* | (2006.01) | |
| *G11C 29/00* | (2006.01) | |
| *G11C 16/04* | (2006.01) | |
| *G11C 29/04* | (2006.01) | |
| *G11C 5/04* | (2006.01) | |
| *G11C 29/44* | (2006.01) | |
| *G11C 29/52* | (2006.01) | |

(52) U.S. Cl.
CPC ...... *G11C 11/4093* (2013.01); *G11C 16/0483* (2013.01); *G11C 29/04* (2013.01); *G11C 29/76* (2013.01); *G11C 29/808* (2013.01); *G11C 29/846* (2013.01); *G11C 29/4401* (2013.01); *G11C 29/52* (2013.01); *G11C 29/74* (2013.01)

(58) Field of Classification Search
CPC ....... G11C 29/04; G11C 29/76; G11C 29/808; G11C 29/846; G11C 29/52; G11C 29/42; G11C 29/44; G11C 29/50012; G11C 29/56008; G06F 11/1068; G06F 11/1044; G06F 11/108
See application file for complete search history.

(56) References Cited

U.S. PATENT DOCUMENTS

| | | | |
|---|---|---|---|
| 8,375,257 | B2 | 2/2013 | Hong et al. |
| 8,719,493 | B2 | 5/2014 | Berke et al. |
| 10,546,628 | B2 * | 1/2020 | Kim ........................ G11C 5/04 |
| 2004/0163028 | A1 | 8/2004 | Olarig |
| 2009/0031078 | A1 | 1/2009 | Warnes et al. |
| 2010/0030942 | A1 | 2/2010 | Hinkle et al. |
| 2010/0217915 | A1 | 8/2010 | O'Connor et al. |
| 2013/0254506 | A1 | 9/2013 | Berke et al. |
| 2014/0047265 | A1 | 2/2014 | Das et al. |
| 2014/0237265 | A1 | 8/2014 | Mothilal |
| 2014/0328132 | A1 | 11/2014 | Cordero et al. |
| 2015/0049539 | A1 | 2/2015 | Wang |
| 2015/0220410 | A1 | 8/2015 | Das et al. |
| 2015/0262633 | A1 | 9/2015 | Lee |
| 2015/0310898 | A1 | 10/2015 | Takefman et al. |
| 2015/0363255 | A1 | 12/2015 | Dell et al. |
| 2016/0110102 | A1 | 4/2016 | Lee |
| 2016/0132241 | A1 | 5/2016 | Perego et al. |
| 2016/0134307 | A1 | 5/2016 | Hu et al. |
| 2016/0232063 | A1 | 8/2016 | Das et al. |
| 2016/0364291 | A1 | 12/2016 | Kang |
| 2017/0287538 | A1 | 10/2017 | Gonzalez |
| 2019/0205225 | A1 | 7/2019 | Kim et al. |
| 2019/0206477 | A1 | 7/2019 | Kim et al. |

FOREIGN PATENT DOCUMENTS

| | | |
|---|---|---|
| WO | 2013142512 A1 | 9/2013 |
| WO | 2015016883 A1 | 2/2015 |

OTHER PUBLICATIONS

List of IBM Patents or Patent Applications Treated as Related; (Appendix P); Date Filed: Nov. 5, 2019, 2 pages.
International Search Report; International Application No. 18/898,023. 9; International Filing Date: Dec. 18, 2018; dated Dec. 18, 2020; 8 pages.

* cited by examiner

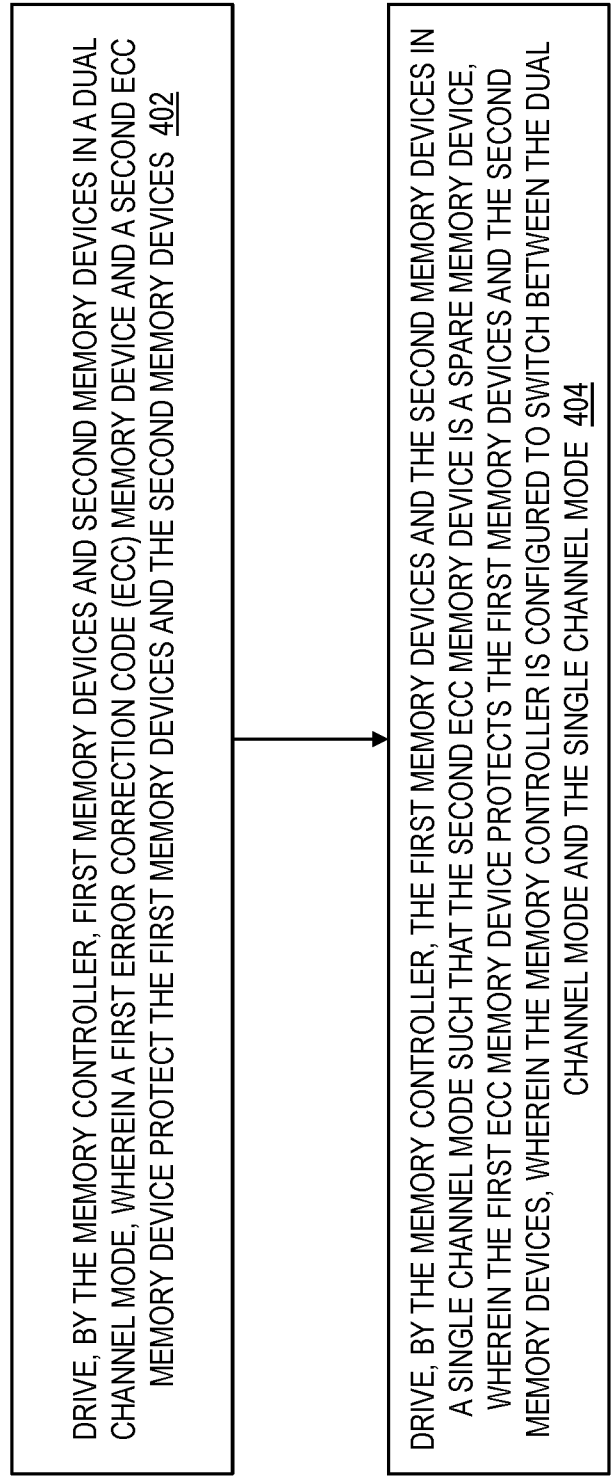

CONFIGURE THE MEMORY CONTROLLER TO OPERATE IN A DUAL CHANNEL MODE, WHEREIN OPERATING IN THE DUAL CHANNEL MODE COMPRISES DRIVING TWO 32 BIT DATA CHANNELS WITH 7 BITS OF ERROR CORRECTING CODE (ECC) MEMORY  502

CONFIGURE THE MEMORY CONTROLLER TO OPERATE IN A SINGLE CHANNEL MODE, WHEREIN OPERATING IN THE SINGLE CHANNEL MODE COMPRISES DRIVING A SINGLE 64 BIT CHANNEL WITH 8 BITS OF ECC MEMORY SUCH THAT AN 8 BIT SPARE MEMORY DEVICE IS AVAILABLE, WHEREIN THE MEMORY CONTROLLER DOES NOT CONCURRENTLY OPERATE IN BOTH THE SINGLE CHANNEL MODE AND THE DUAL CHANNEL MODE  504

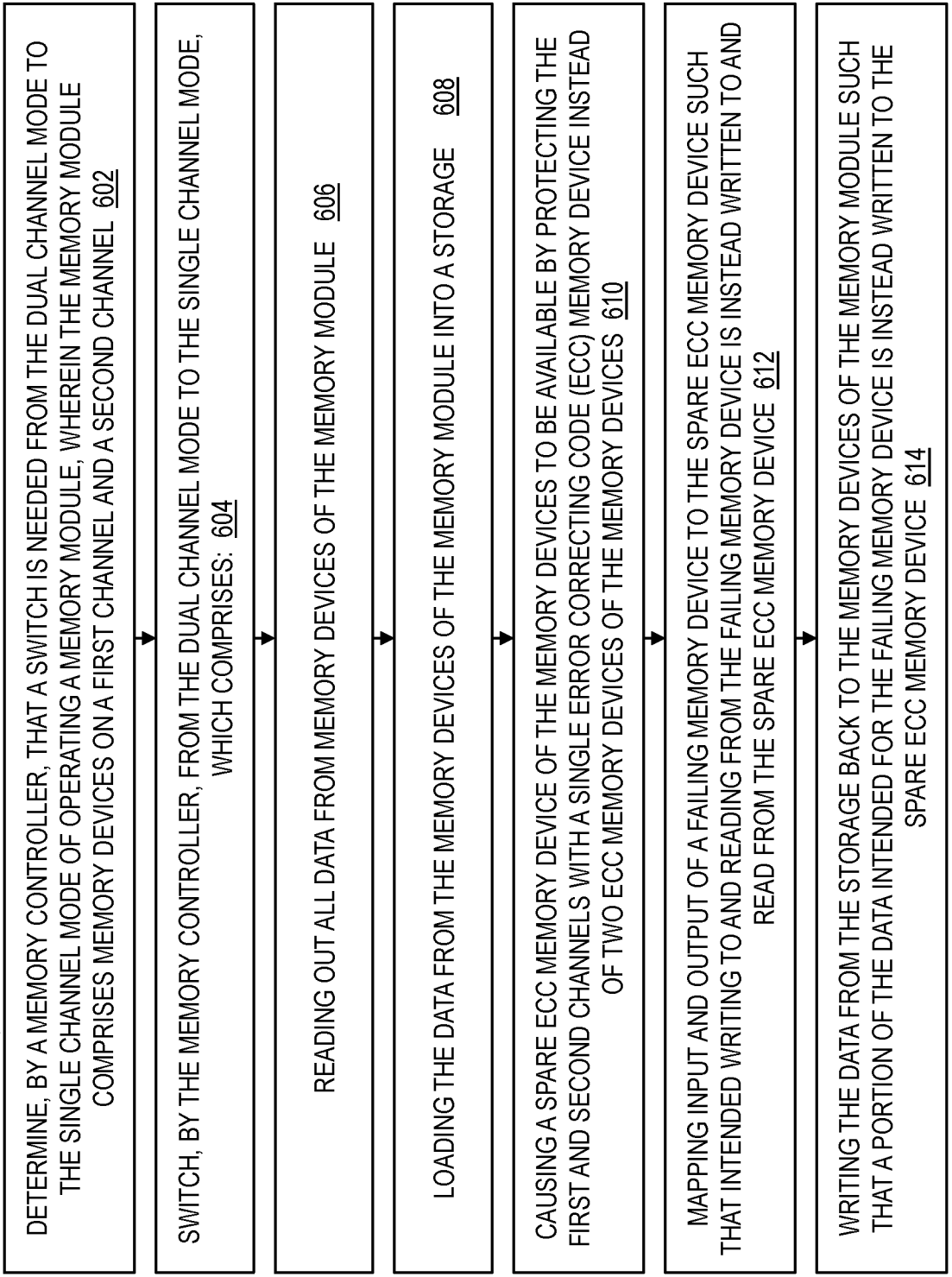

US 11,037,619 B2

USING DUAL CHANNEL MEMORY AS SINGLE CHANNEL MEMORY WITH SPARES

DOMESTIC PRIORITY

This application is a continuation of U.S. patent application Ser. No. 15/860,871, filed Jan. 3, 2018, the disclosure of which is incorporated by reference herein in its entirety.

BACKGROUND

The present invention relates generally to memory modules, and more specifically, to using dual channel memory as single channel memory in a memory module.

A dual in-line memory module (DIMM) includes a series of dynamic random-access memory (DRAM) integrated circuits. These DIMMS are mounted on a printed circuit board and designed for use in, for example, personal computers, workstations, and servers. DIMMs have replaced SIMMs (single in-line memory modules) as the predominant type of memory in state-of-the-art processors. While the contacts on SIMMs on both sides are redundant, DIMMs have separate electrical contacts on each side of the module. Another difference is that standard SIMMs have a 32-bit data path, while standard DIMMs have a 64-bit data path. Many processors have a 64-bit bus width, requiring SIMMs installed in matched pairs in order to populate the data bus. The processor would then access the two SIMMs in parallel. However, DIMMs were introduced to eliminate this disadvantage of SIMMs.

SUMMARY

Embodiments of the present invention are directed to a method for operating a memory controller. Non-limiting examples of the method include driving, by the memory controller, first memory devices and second memory devices of the memory controller in a dual channel mode, where a first error correcting code (ECC) memory device and a second ECC memory device protect the first memory devices and the second memory devices. The method includes driving, by the memory controller, the first memory devices and the second memory devices in a single channel mode such that the second ECC memory device is a spare memory device, wherein the first ECC memory device protects the first memory devices and the second memory devices, wherein the memory controller is configured to switch between the dual channel mode and the single channel mode.

Embodiments of the present invention are directed to a memory controller. Non-limiting examples of the memory controller include a circuit configured to control a memory module, in which the circuit is configured to drive first memory devices and second memory devices in a dual channel mode, where a first error correcting code (ECC) memory device and a second ECC memory device protect the first memory devices and the second memory devices. The circuit is configured to drive the first memory devices and the second memory devices in a single channel mode such that the second ECC memory device is a spare memory device, where the first ECC memory device protects the first memory devices and the second memory devices, where the circuit is configured to switch between the dual channel mode and the single channel mode.

Embodiments of the present invention are directed to a method of switching from dual channel mode to single channel mode. Non-limiting examples of the method include determining, by a memory controller, that a switch is needed from the dual channel mode to the single channel mode of operating a memory module, where the memory module comprises memory devices on a first channel and a second channel, and switching, by the memory controller, from the dual channel mode to the single channel mode. The switching includes reading out all data from memory devices of the memory module, loading the data from the memory devices of the memory module into a storage, causing a spare ECC memory device of the memory devices to be available by protecting the first and second channels with a single error correcting code (ECC) memory device instead of two ECC memory devices of the memory devices, and mapping input and output of a failing memory device to the spare ECC memory device such that intended writing to and reading from the failing memory device is instead written to and read from the spare ECC memory device. The switching includes writing the data from the storage back to the memory devices of the memory module such that a portion of the data intended for the failing memory device is instead written to the spare ECC memory device.

BRIEF DESCRIPTION OF THE DRAWINGS

FIG. 4 is a flow chart of a method for operating the memory controller according to embodiments.

FIG. 5 is a flow chart of a method of configuring a memory controller according to embodiments.

FIG. 6 is a flow chart of a method of switching from dual channel mode to single channel mode according to embodiments.

DETAILED DESCRIPTION

Figure 1:
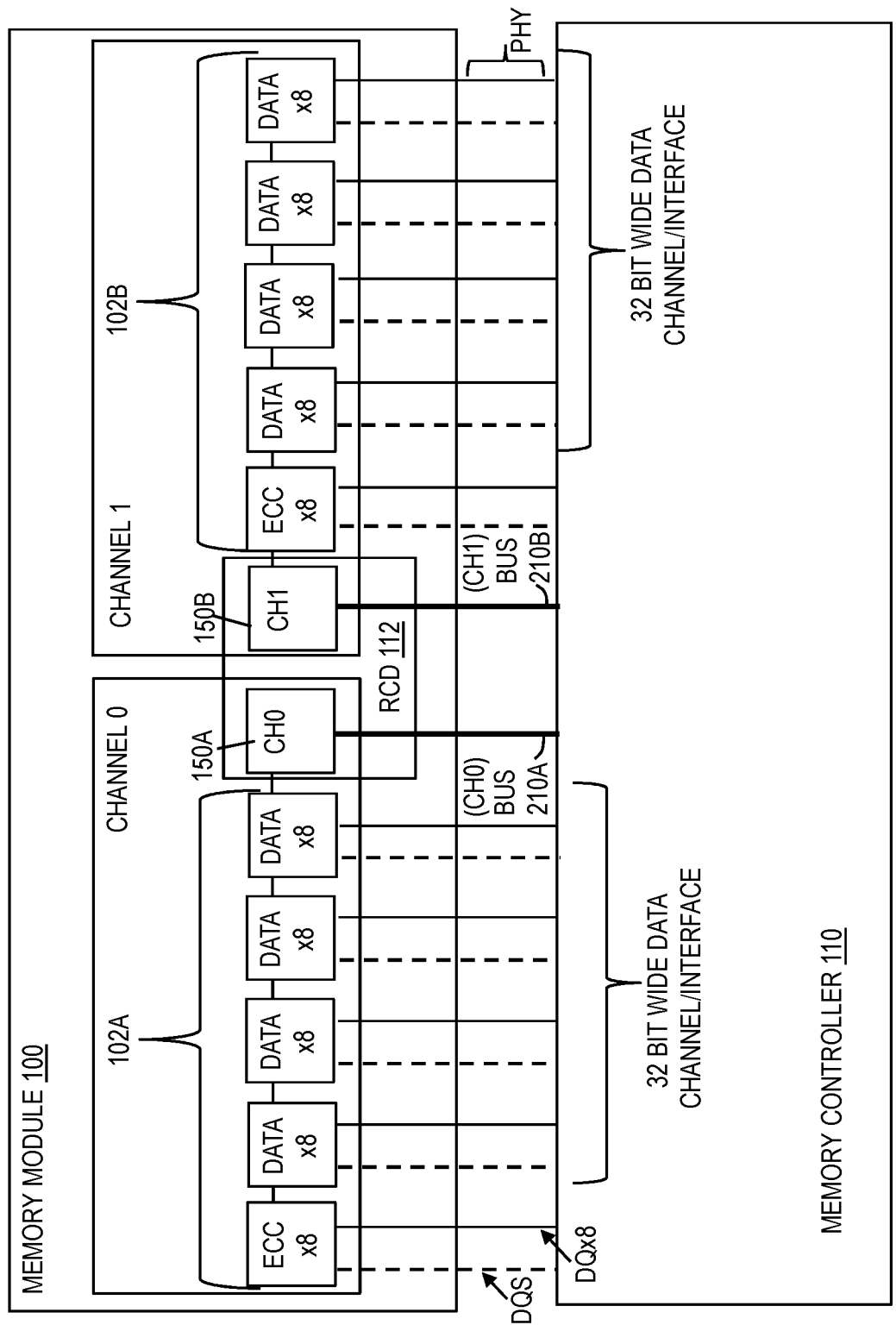
FIG. 1 is a schematic of a memory module connected to a memory controller.

Various embodiments of the invention are described herein with reference to the related drawings. Alternative embodiments of the invention can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The descriptions of the various embodiments of the present invention have been presented for purposes of illustration, but are not intended to be exhaustive or limited to the embodiments discussed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

The term "about" and variations thereof are intended to include the degree of error associated with measurement of the particular quantity based upon the equipment available at the time of filing the application. For example, "about" can include a range of ±8% or 5%, or 2% of a given value.

High end and low end computing systems, in most cases, employ high speed memory interfaces such as those commonly known as double data rate (DDR) synchronous DRAM (SDRAM). DDR memory and the associated interface is bounded by the industry standard specification body known as Joint Electron Device Engineering Council (JEDEC). Although DDR memory is standardized through JEDEC, the need for high and low end computer systems which employ DDR memory subsystems are very different. For example recoverability, availability, and serviceability (RAS), power/thermal, and performance (bandwidth, latency, speed) needs are very different when considering a low end personal computer (PC) versus a high end mainframe. Because lower end computer systems have sales volumes that are much larger than high end computer systems, the lower end system requirements weigh heavier in the standardization of DDR SDRAM module DIMM definitions. This results in a DRAM DIMM that is optimized for the lower end, lower cost computer systems (such as PCs). The higher end computer systems which may require a higher level of RAS and which may include DRAM device sparing are left to develop customized DIMMs, thereby increasing system cost by a significant amount. Embodiments provide a method and system to use a dual memory channel DRAM DIMM (optimized for the lower end computer systems) as a single channel DIMM with sparing. This allows the higher end computer systems to make use of the lower cost DIMM while still achieving a higher level of RAS. A lower end computer system has DIMMs (memory modules) that do not require spare memory devices. However, using the same DIMMs designed for the lower end computer system, embodiments are configured to improve the RAS of the DIMM by creating a spare memory device (i.e., a spare DRAM array).

In the state-of-the-art, there exist dual channel memory systems that run in "lockstep" where the same address is presented to both channels. The state-of-the-art requires the use of two DIMMs. However, embodiments employ only one DIMM even while the dual channel memory system run in "lockstep" in which the same address is presented to both channels. Embodiments allow for use of a single dual channel DIMM as a single channel DIMM (which is like two channels in lockstep) with the added benefit of a spare memory device. In addition to the spare memory (DRAM) device, a spare RCD device can also be deployed. In some embodiments, the spare RCD and spare DRAM memory device may be disabled to save power as compared to running two separate channels with both RCD devices and the spare active on the dual channel DIMM. The state-of-the-art system using the current DDR DIMM technology in pairs do not allow for a spare device. Additionally, embodiments can be performed for a single RCD and for dual RCDs.

FIG. 1 is a schematic of a memory module 100 connected to a memory controller 110. The memory module 100 can be a DDR5 DIMM. In this example, the memory module 100 has channel 0 and channel 1. Channel 0 includes memory devices 102A while channel 1 includes memory devices 102B. The memory devices 102A and 102B are each arrays of DRAM as understood by one skilled in the art. Each of the memory devices 102A and 102B are illustrated as being 8 bit wide chips with the designation "×8" which means by 8. It should be appreciated that the memory devices can be 4 bit wide chips (i.e., ×4). Furthermore, although the memory module is shown composed of ×8 memory devices, the memory module 100 may be composed of DRAM devices (such as memory devices 102A and 102B) of other widths including ×4, ×8, ×16, ×32 or any combination. The memory module 100 in FIG. 1 is shown with two command busses; however it could have 1 or more command address busses.

Channels are the highest level structure as the local memory controller level. Computers can have two, three, or more channels, but two channels are illustrated in this example. Each memory device in channel 0 has a matching memory device in the same location in channel 1.

Channel 0 has a dedicated error correcting code (ECC) memory device 102A while the other memory devices 102A are data memory devices. Similarly, channel 1 has a dedicated error correcting code (ECC) memory device 102B while the other memory devices 102B are data memory devices. The data memory devices 102A in channel 0 and the data memory devices 102B in channel 1 are configured to store data (for reading and writing) as understood by one skilled in the art. The ECC memory device 102A is configured to provide error protection for the data memory devices 102A. The ECC memory device 102B is configured to provide error protection for the data memory devices 102B. In the memory module 100, there are two 32-bit data per channels. This means that the 4 data memory devices 102A in channel 0 provide a 32-bit wide data interface (×32 data per channel) to the memory controller 110, and the 4 data memory devices 102B in channel 1 provide a 32-bit wide data interface (×32 data per channel) to the memory controller 110 for reading or writing. The burst length (BL) can be 16, where over one read or write there are 16 transfers of 32b for a total data transfer of 64B. For a single ECC memory device (such as ECC memory device 102A or ECC memory devices 102B), error correcting code over 32-bits of data requires 7 bits of ECC memory such that an additional 8 bit (×8) ECC memory device is needed per channel. Therefore, a single ECC memory device (such as ECC memory device 102A or ECC memory devices 102B) can only protect a single channel (32-bit data channel). Accordingly, ECC memory device 102A protects the 4 data memory devices 102A (i.e., protects 32-bit data channel which is 4×8=32-bits), and the ECC memory devices 102B protects the 4 data memory devices 102B (i.e., protects 32-bit data channel). Therefore, the memory module 100 requires two ECC memory devices which are illustrated as ECC memory device 102A and ECC memory devices 102B.

The data stored in memory devices 102A and 102B are protected by the error correcting codes (ECC) stored within the ECC device, ECC codes are commonly used with many types of computer data storage to detect and correct the most common kinds of data corruption. Problems can be mitigated by using DRAM modules that include extra memory bits (ECC memory devices 102A and 102B) and memory controller 110 that exploit these bits. These extra bits are used to record parity (i.e., use an error correcting code). Parity allows the detection of all single-bit errors (actually, any odd number of wrong bits). The most common error correcting code, a single-error correction and double-error detection (SECDED) Hamming code, allows a single-bit error to be corrected and (in the usual configuration, with an extra parity bit) double-bit errors to be detected.

A registering/register clock driver (RCD) 112 is connected to both channel 0 and channel 1. The RCD 112 can be a chip on the memory module 100. The RCD 112 is configured for routing and loads to the data memory devices 102A on channel 0 via channel 0 command address (CA) bus 210A and routing and loads to data memory devices 102B on channel 1 via channel 1 command address (CA) bus 210B. The registering/register clock driver 112 is also a buffer device. The RCD 112 is connected to the memory devices 102A (including both data memory devices and the ECC memory devices). The RCD 112 is connected to the memory devices 102B (including both data memory devices and the ECC memory devices).

The RCD 112 includes logic 150A for controlling channel 0 and logic 150B for controlling channel 1 for an industry standard DIMM in the state-of-the-art as understood by one skilled in the art. In normal dual channel mode, the channel 0 logic 150A passes along the command and address information from memory controller 110 to the desired memory devices 102A on one side (channel 0) of the DIMM and the channel 1 logic 150B passes along the command and address information from memory controller 110 to the desired memory devices 102B on the other side (channel 1).

The memory controller 110 is configured to communicate with the memory module 100 via the command address (CA) lines (which are CH0 bus 210A CH1 bus 210B) to the RCD 112. Read and write commands are issued from the memory controller 110 to the RCD 112 for channel 0 via logic 150A and issued from the memory controller 110 to the RCD 112 for channel 1 via logic 150B. For example, a write could be occurring on channel 0 (via CH0 bus 210A) while a read is occurring on channel 1 (via CH1 bus 210B) of the memory module 100. Therefore, all of the software used by the memory controller 110 to control the memory devices 102A and memory devices 102B (i.e., DRAMs) is through the RCD 112. The memory controller 110 can be a DDR5 memory controller with a physical layer interface (PHY) to connect to the memory module 100 (e.g., DDR5 DIMM). Current standards are transitioning from DDR4 to DDR5 as understood by one skilled in the art. Further, each of the memory devices 102A and 102B are connected to the memory controller 110 via DQS and DQx8, where DQS is data strobe and DQx8 is data by 8 bits.

Figure 2:
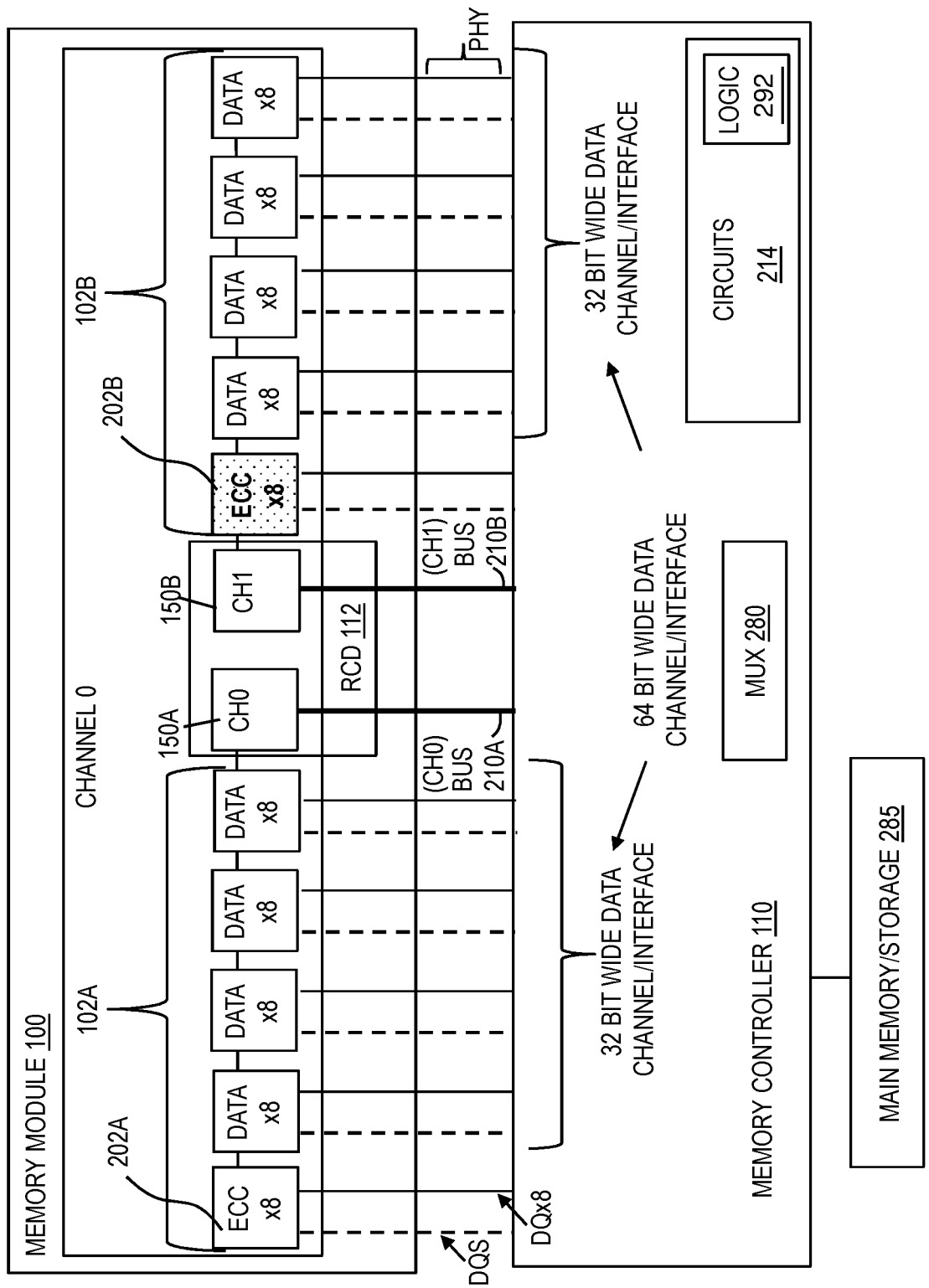
FIG. 2 is a schematic of the memory module connected to a modified memory controller according to embodiments.

FIG. 2 is a schematic of the memory module 100 connected to a modified memory controller 110 according to embodiments. The memory controller 110 can include the functionality of the memory controller 110 discussed above along with additional functionality as discussed herein. Instead of operating the memory module 100 a dual channel memory (i.e., as separate 32-bit data channel 0 and separate 32-bit data channel 1), the memory controller 110 is configured to switch and operate the memory module 100 as a single channel having a single 64-bit data channel 0. In other words, the memory controller 110 is configured to switch from operating the memory module 100 in a dual channel memory mode to a single channel memory mode (and vice versa). For explanation purposes, the single 64-bit data channel 0 is shown but it is understood that the single 64-bit data channel 0 is actually both channels 0 and 1.

In normal dual channel mode, the memory controller 110 is configured to issue the command and address information to the channel 0 logic 150A of the RCD 112 via CH0 command address bus 210A for the memory devices 102A of channel 0. Similarly, the memory controller 110 is configured to issue the command and address information to the channel 1 logic 150B of the RCD 112 via CH1 command address bus 210B for the memory devices 102B of channel 1 in dual channel mode. In dual channel mode, two ECC memory devices, which are ECC memory device 102A and ECC memory device 102B, are needed. However, when combining both channels 0 and 1 as one channel (for example, channel 0) in single channel mode, the memory controller 110 is configured to issue the same command and address information to both channels 0 and 1 at the same time making them act together as one large channel (i.e., as a 64-bit wide data channel) in single channel mode; this command and address information is simultaneously (or nearly simultaneously) issued on CH0 bus 210A and CH1 bus 210B. In single channel mode, only one ECC memory device is needed, which can be either ECC memory device 102A or ECC memory device 102B, as discussed further below. For explanation purposes, ECC memory device 102A is designated for error correcting code memory.

As seen in FIG. 2, embodiments provide the ×64 data per channel driven memory module 100 that can have a burst length (BL) 8 where BL 8 means 8 bursts of data from the memory device/module 100, if a device is a ×8 then 8 bursts of data is equivalent to 64b of data. In a typical DDR4 memory system, the memory devices comprise a 64b wide interface and the standard data transmission is BL8 which is equivalent to 64b of data over 8 bursts which is equivalent to 64 bytes of data. In a DDR5 memory system, there may be BL16 where a data transmission over one 32 bit wide memory channel would be 16 beats of 32 bits per beat which again is equal to 64 bytes as in the DDR4 memory system. Other burst lengths are also possible such as BL4 or BL32. The burst length is the amount of data transferred between the central processor unit (i.e., processor) and memory in each transmission. In FIG. 2, there is 64-bit of data per burst of the BL 8 transmission for a total of 64-byte per write or read and other BL lengths are inclusive to embodiments. Accordingly, error correcting code over (protecting) 64-bits of data requires 8 bits, which means protecting 64-bits of data requires one ×8 ECC memory device 102A or 102B (but not both) in single channel mode. Thus during one BL8 transmission, there is a total of 8-bytes of ECC data. In accordance with embodiments, the memory controller 110 is configured to use the extra ECC memory device as a spare memory device (which is available as a spare data memory device and/or a spare ECC memory device because they both are the same memory device but used for different purposes). The memory controller 110 is configured to utilize one of the ECC memory devices 102A and 102B for error correcting code memory for the single 64-bit data channel (in the single channel mode), while the other unused ECC memory device is a spare (not utilized for ECC). For illustration purposes, the ECC memory device 102A is designated as 202A and the ECC memory device 102B is designated as 202B in order to highlight operation as the ECC memory device protecting 64-bit data interface versus operation as a spare memory device. The ECC memory device 202A of memory devices 102A can operate as the ECC memory device for the single 64-bit data channel in the single channel mode, while the ECC memory device 202B of the memory device 102B operates as the spare memory device. In the event of a failure of any one memory device in the data memory devices 102A and 102B, the memory controller 110 is configured to utilize the spare (ECC) memory device 202B to replace the failed memory device. For explanation purposes and not limitation, the following is an example scenario of how this can be accomplished according to embodiments. The memory controller 110 may begin to use the spare memory device 202B upon certain conditions such a repeated memory transmission fails between the connections of a memory device 102A or 102B and the memory controller 110 or failure of memory storage locations within the memory device 102A or 102B. Typically failures are found when the data is received by the memory controller 110, and the memory controller 110 checks the data against the ECC code (e.g., by using ECC memory device 202A) to indicate erroneous data. Typical ECC codes can be used to correct single bit fails and detect double bit fails. The memory controller 110 can use this checking to determine the location of the fault in the system (memory module 100). Upon detection of fails for a particular memory device 102A or 102B, the memory controller 110 may choose to disable that data memory device (e.g., one data memory device in 102A or 102B) and use a spare ECC memory device 202B. This is usually done while the errors are still correctable. In some embodiments, the memory controller 110 enables the spare device (i.e., spare ECC memory device 202B) and then performs a series of read then write operations through all of memory where the data from the erroneous device (e.g., one data memory device in 102A or 102B) would be read, corrected, and written back to memory. However, on the write, the spare device (i.e., spare ECC memory device 202B) gets a copy of the data from (or intended to) the failing device (e.g., one data memory device in 102A or 102B). This mechanism may require a programmable multiplexer network 280 which allows any memory devices' data to be written to another memory device on the DIMM. Therefore, if a data memory device 102A, 102B fails or if the ECC memory device 202A fails, the memory controller 110 can switch to the spare memory device 202B as a data memory device or an ECC memory device as needed. The memory controller 110 is configured to issue the necessary commands to the address of the spare memory device 202B via CH0 bus 210A and CH1 bus 210B instead of the failed memory device, thereby having implemented RAS when the memory module 100 was originally designed without RAS (i.e., without a spare memory device 202B).

In FIG. 2, the operation of the DDR5 DIMM as a single channel requires no modification to the DDR5 DIMM (memory module 100) itself. However, the memory controller 110 is configured to drive the same command and address (CA) to both channels 0 and 1 (via busses 210A and 210B) creating a single double wide channel in which the memory module 100 now has spare memory device 202B. In some embodiments, the memory controller 110 is configured to turn off the ECC memory device 202B (of the memory devices 102B) and/or disable the ECC memory device 202B from functioning as error correcting code memory, such that the ECC memory device 202B is available as a spare. In single channel mode, the memory controller 110 is configured to issue any commands to the ECC memory device 202A which would have previously been addressed to the ECC memory device 202B. Also, in the event of a failure to any one of the memory devices 102A and 102B, the memory controller 110 is also configured to address commands to the spare (ECC) memory device 202B in order to save data on the spare (ECC) memory device 202B. The memory controller 110 is configured with circuits 214 as hardware to function as discussed herein. The circuits 214 can include logic 292, buffers, etc., to operate has discussed herein. The memory controller 110 includes the standard hardware to operatively connect to the memory module and a central processing unit (i.e., processor not shown) as understood by one skilled in the art. In one case, the logic 292 can include firmware and/or minicode such that the circuit 214 executes the logic 292 to operate as discussed herein. The logic 292 can be in the form of executable instructions, application specific integrated circuits (ASIC), etc.

The memory controller 110 can be switched back and forth between operating the memory module 100 in dual channel mode and single channel mode. For example, a user can select a setting of single channel mode and/or dual channel mode on the memory controller 110. For example, upon the memory controller 110 detecting a failed memory device in the memory devices 102A and 102B, the memory controller 110 can be configured to switch from dual channel mode (i.e., operating channel 0 and channel 1 separately) to single channel mode such that the spare memory device 202B can be utilized in place of the failed memory device. For explanation purposes and not limitation, the following is an example scenario of how the memory controller 110 can switch from dual channel mode to single channel mode. Typically, when running in dual channel mode, there are no spare devices because each 32b wide channel (of memory devices 102A and 102B) is using its ECC memory devices (ECC memory devices 202A and 202B, respectively) to detect and correct fails on their respective channels 0 and 1. However, in one embodiment, should the single bit error rate on any data memory device begin to increase (e.g., the bit error rate reaches a predefined threshold), the memory controller 110 recognizes reaching the predefined threshold as a trigger that the memory controller 110 needs to spare out the failing device. The memory controller 110 is configured to spare out the failing memory device. Yet, in the dual channel configuration, there are no spare devices, and the memory controller 110 is configured to switch from dual channel mode to single channel mode (thereby making a spare memory device available to be used in place of the failing memory device). In the dual channel system, this switch may require the memory controller 110 to read out all data from the DIMM from both channels (i.e., read out all data from both memory devices 102A and 102B), to place the data into storage 285 (e.g., main memory), to switch the memory module 100 into single channel mode where there is one 64b wide channel which requires one ECC device (e.g., ECC memory device 202A) leaving one ECC device unused as a spare (e.g., spare ECC memory device 202B). The memory controller 110 is configured to map the failing device (e.g., one data memory device 102A (or one data memory device 102B)) to the unused ECC device e.g., spare ECC memory device 202B) as a spare and then write all of the memory back to the DIMM (into the respective memory devices 102A and 102B).

It should be appreciated that the memory controller 110 is configured to run in either two 32-bit data channels with 7 bit ECC code (i.e., dual channel mode) and switch to a single 64b channel with 8 bit ECC code and 8 bit spare memory device (i.e., single channel mode), when using a standard DDR5 DIMM (memory module 100). With typical SECDED (single error correct, dual error detect) ECC coding, the number of bits required to detect and correct fails reduces and the number of bits being checked increases. To cover 32$b$ of data with SECDED ECC, seven bits of ECC code are required, and to cover 64$b$ of data with SECDED ECC, only one more bit of ECC code is required for a total of 8 bits. Dual channel mode issues command and address information separately and independently on the CH0 bus 210A and CH1 bus 210B. Single channel mode issues the same command and address information on both CH0 bus 210A and CH1 bus 210B.

Figure 3:
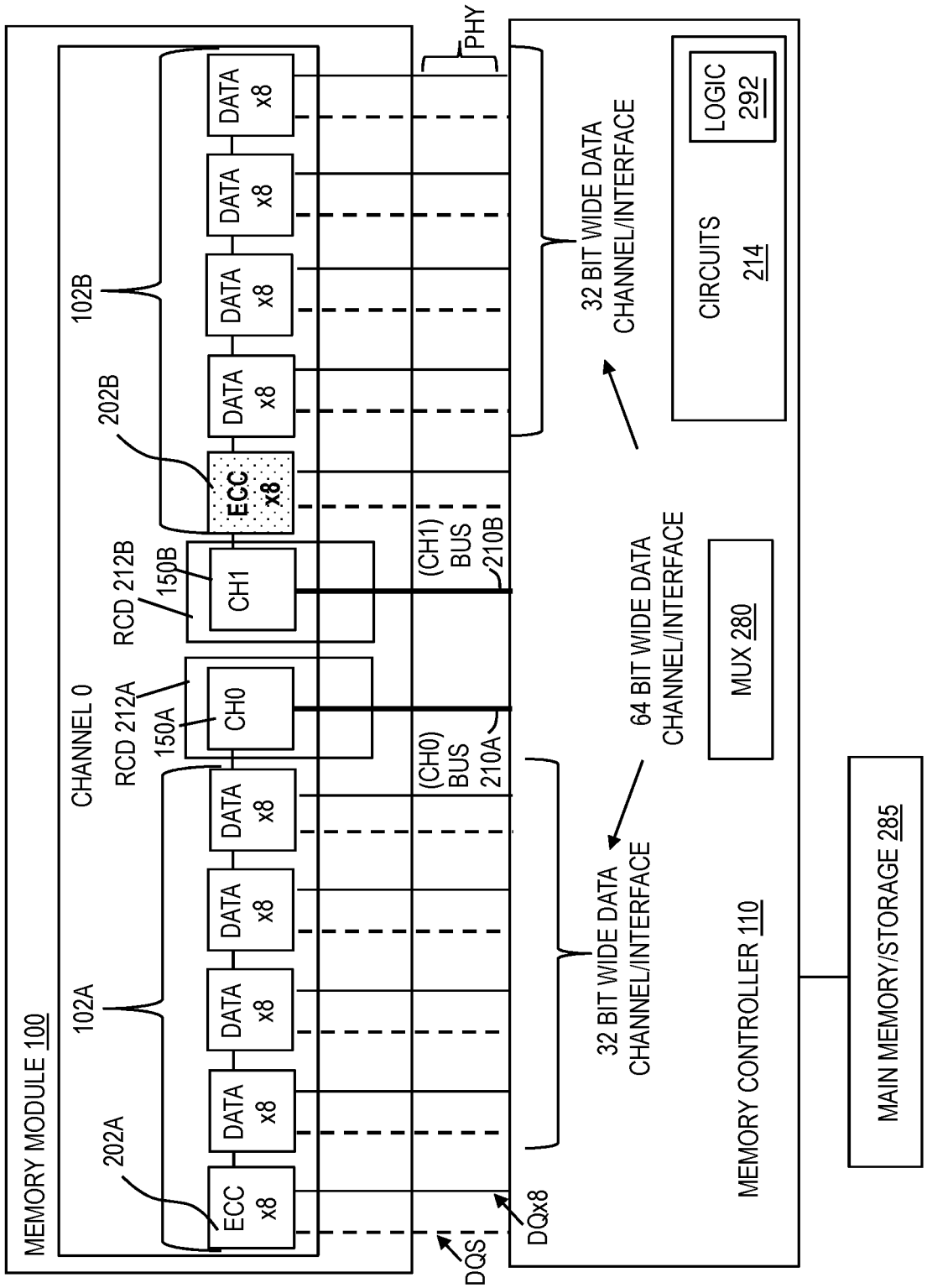
FIG. 3 is a schematic of a modified memory module connected to the modified memory controller according to embodiments.

FIG. 3 is a schematic of a modified memory module 100 connected to the modified memory controller 110 according to embodiments. FIG. 3 illustrates a case in which the memory module 100 has more than one RCD. In this case, the memory module 100 is depicted with two RCDs designated as RCD 212A and RCD 212B. The RCD 212A has the logic 150A for channel 1 while the RCD 212B has the logic for 150B for channel 2. Just as discussed herein, the memory controller 110 is configured to operate the memory module 100 in dual channel mode where command and address information issued on bus 210A to memory devices 102A (via logic 150A of RCD 212A) is independent of the command and address information issued on bus 210B to the memory device 102B (via logic 150B of RCD 212B). Independent means that one type of command such as a write command can be issued on CH0 bus 210A, while another type of command such as read command is concurrently issued on CH1 bus 210B. The memory controller 110 is configured to operate the memory module 100 in single channel mode where the same command and address information is issued on both busses 210A and 210B to the memory devices 102A and 102B via logic 150A and 150B of RCDs 212A and 212B.

The command address and data busses 210A and 210B can be singled ended or differential.

FIG. 4 is a flow chart 400 of a method for operating the memory controller 110 according to embodiments. At block 402, the memory controller 110 is configured to drive the first memory devices 102A and the second memory devices 102B in a dual channel mode, where a first error correction code (ECC) memory device 202A and a second ECC memory device 202B protect the first memory devices 102A and the second memory devices 102B.

At block 404, the memory controller 110 is configured to drive the first memory devices 102A and the second memory devices 102B in a single channel mode such that the second ECC memory device 202B is a spare memory device, where the first ECC memory device 202A protects the first memory devices 102A and the second memory devices 102B, where the memory controller 110 is configured to switch between the dual channel mode and the single channel mode.

The memory module 100 is dynamic random access memory (DRAM). The memory module is a DRAM dual in-line memory module (DIMM).

The first memory devices 102A include first data memory devices 102A configured for data storage and the first ECC memory device 202A configured for error correction. The second memory devices 102B include second data memory devices 102B configured for data storage and the second ECC memory device 202B configured for error correction. The memory controller 110 is configured to disable the second ECC memory device 202B during the single channel mode such that the second ECC memory device 202B is the spare memory device.

The memory controller 110 is configured to detect a failed memory device from the first memory devices 102A and the second memory devices 102B. The memory controller 110 is configured to replace the failed memory device with the spare memory device such that the spare memory device operates in place of the failed memory device in the memory module 100. In response to detecting the failed memory device, the memory controller 110 is configured cause the spare memory device to operate in place of any one of the first data memory devices 102A, the first ECC memory device 202A, and the second memory devices 102B.

The first data memory devices 102A have a 32-bit wide data interface and the second data memory devices 102B have another 32-bit wide data interface. During the single channel mode, the memory controller 110 is configured to cause the first ECC memory device 202A to protect a 64-bit wide data interface for both the first data memory devices 102A and the second data memory devices 102B, and the 64-bit wide data interface is a combination of the 32-bit wide data interface and the another 32-bit wide data interface. The first ECC memory device 202A is 8 bits, and the second ECC memory device 202B is 8 bits.

FIG. 5 is a flow chart 500 of a method of configuring a memory controller 110 according to embodiments. At block 502, the memory controller 110 is configured to operate in a dual channel mode, where operating in the dual channel mode includes driving two 32-bit data channels with 7 bits of error correcting code (ECC) memory (ECC memory devices 202A and 202B). Although the ECC memory devices 202A and 202B have 8 bits each, only 7 bits of the 8 bits are needed in each of the ECC memory devices 202A and 202B.

At block 504, the memory controller 110 is configured to operate in a single channel mode, where operating in the single channel mode includes driving a single 64-bit channel with 8 bits of ECC memory (e.g., ECC memory device 202A) such that an 8 bit spare memory device (e.g., ECC memory devices 202B) is available, where the memory controller 110 does not concurrently operate in both the single channel mode and the dual channel mode.

FIG. 6 is a flow chart 600 of a method of switching from dual channel mode to single channel mode according to embodiments. At block 602, the memory controller 110 is configured to determine (e.g., via circuits 214 and logic 292) that a switch is needed from the dual channel mode (e.g., separately operating both channel 0 and channel 1) to the single channel mode of operating a memory module 100. The memory module 100 comprises memory devices 102A and 102B on a first channel (e.g., channel 0) and a second channel (e.g., channel 1).

At block 604, the memory controller 110 is configured to switch from the dual channel mode to the single channel mode (e.g., operating both channels 0 and 1 as a single channel 0), which comprises: reading out all data from the memory devices 102A and 102B of the memory module 100 (at block 606), loading the data from the memory devices 102A and 102B of the memory module 100 into a storage/main memory 285 (at block 608), causing a spare ECC memory device 202B of the memory devices to be available by protecting the first and second channels 0 and 1 with a single error correcting code (ECC) memory device 202A instead of two ECC memory devices (instead of both ECC memory devices 202A and 202B) of the memory devices 102A, 102B (at block 610), mapping input and output (e.g., via multiplexer network 280) of a failing memory device (e.g., one of the memory devices from either 102A of 102B) to the spare ECC memory device 202B such that intended writing to and reading from the failing memory device is instead written to and read from the spare ECC memory device 202B (at block 612), and writing the data from the storage 285 back to the memory devices 102A and 102B of the memory module 100 such that the part/portion of the data intended for the failing memory device is instead written to the spare ECC memory device 202B (at block 614).

The memory controller 110 is configured to determine that the switch is needed from the dual channel mode to the single channel mode of operating the memory module by recognizing that a predefined trigger occurs during operation in the dual channel mode in which no spare memory device is available on the memory module. The predefined trigger occurs when a single bit error rate on any one of the memory devices reaches a predefined threshold. The failing memory device causes the predefined trigger to occur.

Technical effects and benefits include a structure and method for providing a spare memory device from a standard memory module. Technical effects and benefits include a memory controller configured to run in either two 32-bit data channel with 7 bit ECC code and switch to a single 64-bit channel with 8 bit ECC code and an 8-bit spare memory device when using a standard DDR5 DIMM. Further, technical benefits allow a memory module having no RAS (i.e., no spare memory device) originally designed for low end computers to be utilized as a memory module with RAS (i.e., with a spare memory device) for high end computers.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for operating a memory controller, the method comprising:
   driving first memory devices and second memory devices of the memory controller in a dual channel mode, a first error correcting code (ECC) memory device and a second ECC memory device protecting the first memory devices and the second memory devices; and
   driving the first memory devices and the second memory devices in a single channel mode such that the second ECC memory device is a spare memory device having been disabled for error correction, the first ECC memory device protecting the first memory devices and the second memory devices in the single channel mode, the memory controller being configured to disable the second ECC memory device during the single channel mode such that the second ECC memory device is the spare memory device.

2. The method of claim 1, wherein the first memory devices and the second memory devices are dynamic random access memory (DRAM).

3. The method of claim 1, wherein the first memory devices and the second memory devices are a DRAM dual in-line memory module (DIMM).

4. The method of claim 1, wherein:
   the first memory devices comprise first data memory devices configured for data storage and the first ECC memory device configured for error correction; and
   the second memory devices comprise second data memory devices configured for data storage and the second ECC memory device configured for error correction.

5. The method of claim 4, wherein:
   the memory controller is configured to detect a failed memory device from the first memory devices and the second memory devices; and
   the memory controller is configured to replace the failed memory device with the spare memory device such that the spare memory device operates in place of the failed memory device.

6. The method of claim 5, wherein, in response to detecting the failed memory device, the memory controller is configured to cause the spare memory device to operate in place of any one of the first data memory devices, the first ECC memory device, and the second memory devices.

7. The method of claim 4, wherein the first data memory devices have a 32-bit wide data interface and the second data memory devices have another 32-bit wide data interface.

8. The method of claim 7, wherein, during the single channel mode, the memory controller is configured to cause the first ECC memory device to protect a 64-bit wide data interface for both the first data memory devices and the second data memory devices, the 64-bit wide data interface comprising the 32-bit wide data interface and the another 32-bit wide data interface.

9. The method of claim 1, wherein the first ECC memory device is 8-bits.

10. A memory controller comprising:
    a circuit configured to control a memory module, the circuit being configured to:
    drive first memory devices and second memory devices of the memory controller in a dual channel mode, a first error correcting code (ECC) memory device and a second ECC memory device protecting the first memory devices and the second memory devices; and
    drive the first memory devices and the second memory devices in a single channel mode such that the second ECC memory device is a spare memory device having been disabled for error correction, the first ECC memory device protecting the first memory devices and the second memory devices in the single channel mode the circuit being configured to disable the second ECC memory device during the single channel mode such that the second ECC memory device is the spare memory device.

11. The memory controller of claim 10, wherein the first memory devices and the second memory devices are dynamic random access memory (DRAM).

12. The memory controller of claim 10, wherein the memory module is a DRAM dual in-line memory module (DIMM).

13. The memory controller of claim 10, wherein:
    the first memory devices comprise first data memory devices configured for data storage and the first ECC memory device configured for error correction; and
    the second memory devices comprise second data memory devices configured for data storage and the second ECC memory device configured for error correction.

14. The memory controller of claim 13, wherein: the circuit is configured to detect a failed memory device from the first memory devices and the second memory devices; the circuit is configured to replace the failed memory device with the spare memory device such that the spare memory device operates in place of the failed memory device; and in response to detecting the failed memory device, the circuit is configured to cause the spare memory device to operate in place of any one of the first data memory devices, the first ECC memory device, and the second memory devices.

15. The memory controller of claim 13, wherein the first data memory devices have a 32-bit wide data interface and the second data memory devices have another 32-bit wide data interface.

16. The memory controller of claim 15, wherein, during the single channel mode, the circuit is configured to cause the first ECC memory device to protect a 64-bit wide data interface for both the first data memory devices and the second data memory devices, the 64-bit wide data interface comprising the 32-bit wide data interface and the another 32-bit wide data interface.

17. The memory controller of claim 13, wherein the first ECC memory device is 8 bits.

18. A method of switching from dual channel mode to single channel mode, the method comprising:
    determining that a switch is needed from the dual channel mode to the single channel mode of operating a memory module, the memory module comprising memory devices on a first channel and a second channel; and
    switching from the dual channel mode to the single channel mode, which comprises causing a spare error correcting code (ECC) memory device of the memory devices to be available by protecting the first and second channels with a single ECC memory device instead of two ECC memory devices of the memory devices, a second ECC memory device of the two ECC memory devices being configured to be switched from protecting the first and second channels to operating as one of the memory devices via commands from a register clock driver (RCD).

\* \* \* \* \*